(12) United States Patent
Morino et al.

(10) Patent No.: US 7,646,055 B2
(45) Date of Patent: Jan. 12, 2010

(54) SEMICONDUCTOR DEVICE AND METHOD OF FABRICATION THEREOF

(75) Inventors: Yasuki Morino, Hyogo (JP); Yoshihiko Kusakabe, Hyogo (JP); Ryuichi Wakahara, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 12/219,402

(22) Filed: Jul. 22, 2008

(65) Prior Publication Data

US 2008/0290453 A1 Nov. 27, 2008

Related U.S. Application Data

(62) Division of application No. 11/159,389, filed on Jun. 23, 2005, now abandoned.

(30) Foreign Application Priority Data

Jun. 25, 2004 (JP) .............................. 2004-188438
Jun. 14, 2005 (JP) .............................. 2005-173297

(51) Int. Cl.
*H01L 29/788* (2006.01)
(52) U.S. Cl. ................ 257/315; 257/314; 257/316; 257/317; 257/318; 257/319; 257/320; 257/321; 257/E21.442
(58) Field of Classification Search ......... 257/314–321, 257/E21.442
See application file for complete search history.

(56) References Cited

U.S. PATENT DOCUMENTS 6,620,681 B1  9/2003  Kim et al.

| | | | |
|---|---|---|---|
| 2002/0195645 A1 | 12/2002 | Takada et al. | |
| 2003/0213991 A1* | 11/2003 | Lee et al. | 257/316 |
| 2004/0115885 A1* | 6/2004 | Park et al. | 438/257 |
| 2005/0009274 A1* | 1/2005 | Dong | 438/257 |
| 2005/0048708 A1 | 3/2005 | Yamada et al. | |

FOREIGN PATENT DOCUMENTS

| JP | 08-204039 | 8/1996 |
|---|---|---|
| JP | 2001-118944 | 4/2001 |

OTHER PUBLICATIONS

Shimizu et al.; "A Novel High-Density 5F$^2$ NAN STI Cell Technology Suitable for 256Mbit and 1Gbit Flash Memories"; *International Electron Devices Meeting*; c. 1997; pp. 271-274.

* cited by examiner

*Primary Examiner*—Kiesha L. Rose
*Assistant Examiner*—Minchul Yang
(74) *Attorney, Agent, or Firm*—McDermott Will & Emery LLP

(57) ABSTRACT

A method includes the steps of: introducing insulation film into a trench to provide a trench isolation; planarizing the trench isolation to expose a passivation film; and removing the passivation film and depositing a second silicon layer on a first silicon layer and the trench isolation; and in the step of depositing the first silicon layer the first silicon layer is an undoped silicon layer and in the step of depositing the second silicon layer the second silicon layer is a doped silicon layer or an undoped silicon layer subsequently having an impurity introduced thereinto or the like and thermally diffused through subsequent thermal hysteresis into the first silicon layer.

12 Claims, 3 Drawing Sheets

SEMICONDUCTOR DEVICE AND METHOD OF FABRICATION THEREOF

RELATED APPLICATIONS

This application is a Divisional of U.S. application Ser. No. 11/159,389, filed Jun. 23, 2005, now abandoned claiming priority of Japanese Application Nos. 2004-188438, filed Jun. 25, 2004, and 2005-173297, filed Jun. 14, 2005, the entire contents of each of which are hereby incorporated by reference.

BACKGROUND OF THE INVENTION

1. Field of the Invention

The present invention relates generally to semiconductor devices and methods of fabrication thereof and particularly to those utilizing self-aligned shallow trench isolation (SA-STI) for forming a gate electrode and an active region simultaneously.

2. Description of the Background Art

For flash memory, self-aligned shallow trench isolation (SA-STI) has conventionally been employed. SA-STI allows a floating gate electrode's polysilicon and a shallow trench isolation (STI) to be formed with a single mask in self alignment. This technique has the following advantages:

First, the STI is formed after a tunnel insulation film (or gate insulation film) is provided. This can prevent the tunnel insulation film from falling in at an end of an active region and thus thinning as typical STI would not avoid. As such, SA-STI can enhance the tunnel insulation film in reliability.

Second, a trench and a floating gate are formed with a single mask. This can prevent accumulated alignment errors and thus advantageously contribute to high integration involving microfabrication.

Furthermore, in recent years, to ensure capacitive coupling, a first polysilicon for a floating gate has a second polysilicon further deposited thereon to overhang on an STI (see SHIMIZU et al., "A Novel High-Density $5F^2$ NAND STI Cell Technology Suitable for 256 Mbit and 1 Gbit Flash Memories", International Electron Devices Meeting, December 1997, pp. 271-274).

A conventional flash memory fabrication method will now be described. Initially on a semiconductor substrate a tunnel insulation film is formed and thereon a first silicon layer and a temporal passivation film implemented by a silicon nitride film are sequentially deposited. Subsequently a single mask is used to etch the silicon nitride film and the first silicon film, and the tunnel insulation film and the substrate to form a trench. Furthermore, the trench is filled with insulation film to provide a trench insulation which is in turn planarized to expose a surface of the silicon nitride film, and the silicon nitride film is then removed.

Subsequently on the first silicon layer and the trench insulation a second silicon layer is deposited for a floating gate. Then the second silicon layer on the trench insulation is partially removed to form a second silicon layer pattern to complete isolation by SA-STI.

The above described SA-STI has been improved in recent years, as disclosed as follows: in a first improvement, after the silicon nitride film is removed an oxide film is etched to recede an isolation oxide film. This can reduce residue of the first silicon layer in etching for a gate and prevent short circuit between gates. In a second improvement, a first polysilicon is used as a nucleus to selectively grow a second silicon layer. This selective growth can eliminate the necessity of patterning the second silicon layer to finely isolate adjacent gates (see Japanese Patent Laying-Open No. 2001-118944). Furthermore, in a third improvement, etching for a trench is followed by etching a first silicon layer's sidewall and a silicon substrate's sidewall to recede them. This can reduce residue of the first silicon layer in etching for a gate and prevent short circuit between gates.

Such conventional SA-STI as described above can prevent short circuit between gates, eliminate a patterning step, and the like as a silicon electrode is improved in geometry. However, the first silicon layer itself is deposited in a method selected as appropriate and at a temperature selected as appropriate, and a tunnel insulation film that contacts the first silicon layer thus deposited is impaired in characteristic. As a result, device characteristics, reliability and the like can be impaired.

For example if the first silicon layer is implemented by a polysilicon film deposited at least 600° C. to have a small thickness of at most 20 nm, it tends to be substantially all defective in withstand voltage because of a tunnel oxide film's defect. If the first silicon layer is deposited to have a thickness exceeding 70 nm, the polysilicon film will have a maximum crystal grain size larger than approximately 70 nm, however the layer may be deposited. The increased crystal grain size is promoted for example by a gate's dimensional variation and causes disadvantageously varying distribution of Vth (a value in voltage of a threshold of a transistor) after erasure operation.

As such, when the chip is seen as a whole, post-erasure Vth distribution has an increased range and recovering an over-erased bit requires time, and erasure operation cannot be completed in a short period of time. Furthermore, if the recovery requires a significantly long period of time, disadvantageously reduced yield can be provided. Furthermore, for device operation, it may be necessary to introduce P or the like as dopant to reduce the first silicon layer in resistance, form a diode, and/or the like. If the first silicon layer is formed of P doped amorphous silicon, however, an increased crystal grain size is provided regardless of film thickness and a problem similar to that described above arises. To meet a demand for improved device operability, however, an appropriate concentration of P must be introduced as dopant.

As has been described above, when SA-STI is employed, controlling the quality of a polysilicon layer of a floating gate that is directly in contact with a tunnel oxide film, is significantly important in improving device performance.

SUMMARY OF THE INVENTION

The present invention contemplates a nonvolatile memory device and a method of fabrication thereof that can ensure a tunnel insulation film's characteristic(s) and in addition prevent Vth distribution from having increased ranges after erasure operation and, in a particular case, in addition thereto improve device operation performance.

The present nonvolatile memory device is fabricated in a method including the steps of: forming a gate insulation film on a semiconductor substrate; forming a first silicon layer on the gate insulation film; forming a passivation film over the first silicon layer; employing a single mask and thus etching the passivation film, the first silicon layer, the gate insulation film and the semiconductor substrate to provide a trench; filling the trench with insulation film to provide an isolating insulation film; planarizing the isolating insulation film to expose the passivation film; removing the passivation film and forming a second silicon layer on the first silicon layer and the isolating insulation film; and patterning the second silicon layer. In the step of forming the first silicon layer, the first silicon layer is an undoped silicon layer. In the step of forming the second silicon layer, the second silicon layer is a doped silicon layer or an undoped silicon layer subsequently having an impurity introduced thereinto or the like and thermally diffused through subsequent thermal hysteresis or process into the first silicon layer.

By the above described method the first silicon layer of polysilicon can have crystal grains that are not increased in size to be unsuitable for practical use and the impurity in the second silicon can also be thermally diffused into the first silicon layer. As a result, Vth after erasure operation can have a distribution prevented from expansion in width and the first silicon layer can also have the impurity at a concentration controlled as appropriate to provide improved device operation performance.

To achieve the above impurity concentration distribution it is necessary that thermal hysteresis or process corresponding to 900° C.×15 minutes be added in a subsequent process step. In fabricating a nonvolatile memory device this level of thermal process is normally applied. Furthermore, the second silicon layer that overlies the first silicon layer may be in contact with the first silicon layer or another layer may be posed therebetween.

The present nonvolatile memory device includes a semiconductor substrate, isolating insulation films introduced into a trench in the semiconductor substrate and having a portion protruding above the semiconductor substrate, and a gate insulation film formed between the isolating insulation films on and in contact with the semiconductor substrate. Furthermore the present nonvolatile memory device includes a first polysilicon layer formed on and in contact with the gate insulation film and a second polysilicon layer formed on the first polysilicon layer, and the first polysilicon layer is smaller in crystal grain size than the second polysilicon layer and can have a crystal grain size for example of at most 70 nm.

Thus the first polysilicon layer can be prevented from having crystal grains increased in size, and Vth after erasure operation can have a distribution prevented from expansion in width. As a result, disadvantageously increased periods of time otherwise required to recover an overerased bit can be resolved.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Hereinafter, reference will be made to the drawings to describe the embodiments of the present invention.

First Embodiment

Figure 1:
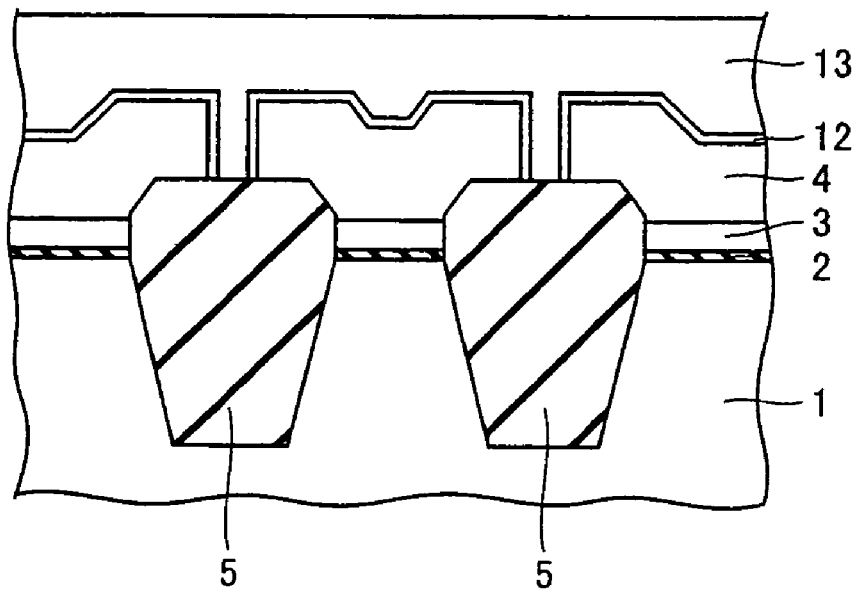
FIG. 1 shows a portion corresponding to the present nonvolatile memory device in a first embodiment.

FIG. 1 is a cross section of the present nonvolatile memory device in a first embodiment as fabricated by SA-STI. In the figure, a semiconductor substrate 1 is provided with a plurality of element isolating insulation films (STIs) 5. Between STIs 5 is located an active region having a tunnel insulation film arranged thereon to form a gate insulation film 2. Furthermore on tunnel insulation film 2 a first silicon layer 3 and a second silicon layer 4 are deposited in layers to act as a floating gate, and thereon a control gate 13 is provided with an interlayer dielectric film 12 posed therebetween. Note that the first silicon layer 3 is located between two isolating insulation films 5 protruding above semiconductor substrate 1 and preferably has a thickness to have a height smaller than that of that portion of isolating insulation film 5 which protrudes.

Figure 2:
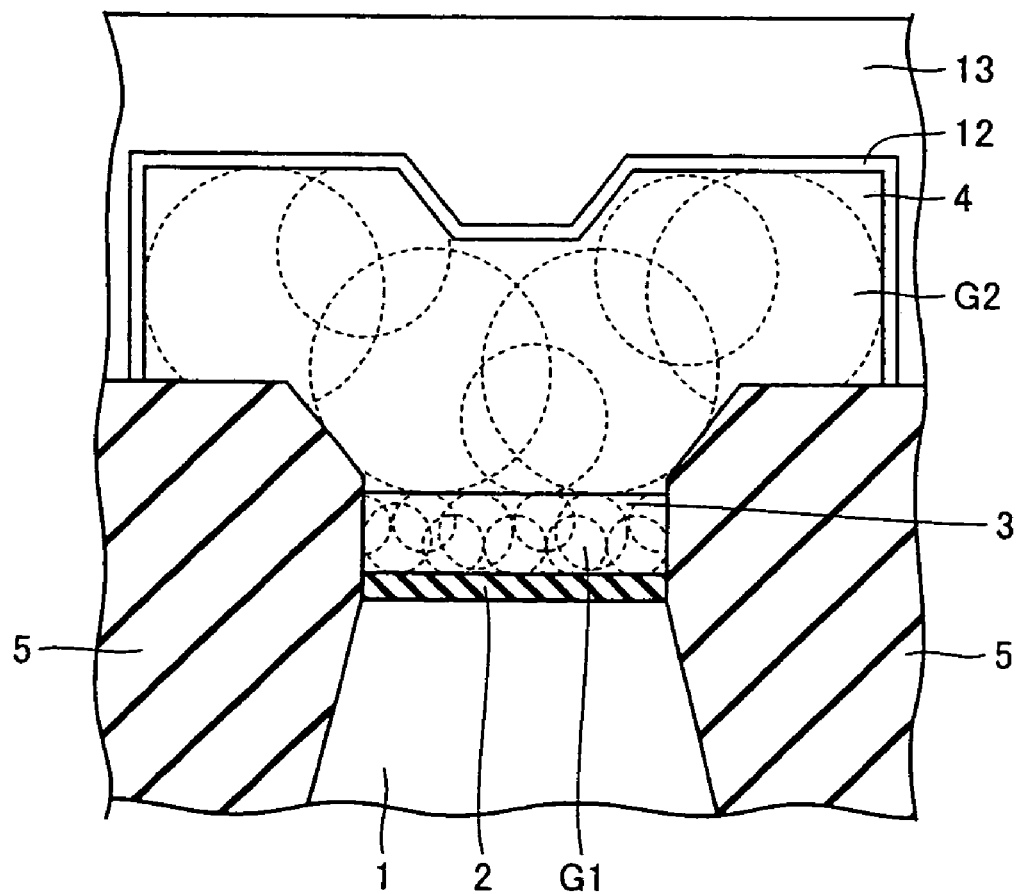
FIG. 2 is a partially enlarged view of FIG. 1.

FIG. 2 is a partially enlarged view of FIG. 1. In the present embodiment, as shown in FIG. 2, tunnel insulation film 2 contacts the first polysilicon layer 3 having crystal grains G1 having a size of approximately 30 nm, which is significantly smaller than the overlying second polysilicon layer's crystal grains G2 having a size of at least approximately 100 nm n. Normally, polysilicon has a crystal grain size having a distribution range. In the present embodiment the first polysilicon layer's crystal grain G1 has a maximum grain size of at most 70 nm and the overlying second polysilicon layer's crystal grain G2 has a maximum grain size of at least 100 nm.

Figure 3:
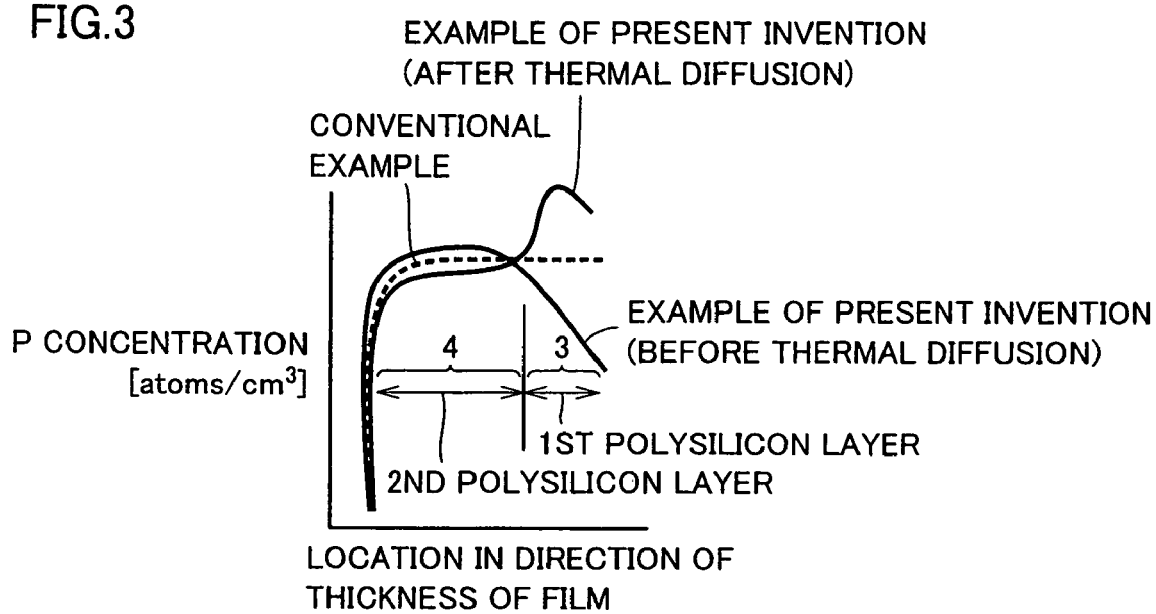
FIG. 3 represents a distribution in concentration of P as an impurity in first and second polysilicon layers (a comparison between an example of the present invention and a conventional example).

Furthermore, as shown in FIG. 3, an impurity of phosphorus (P) has a concentration approximately twice higher in the first polysilicon layer 3 than the second polysilicon layer 4. Furthermore the P's concentration distributes to have a relative maximum in the first polysilicon layer 3.

Figure 4:
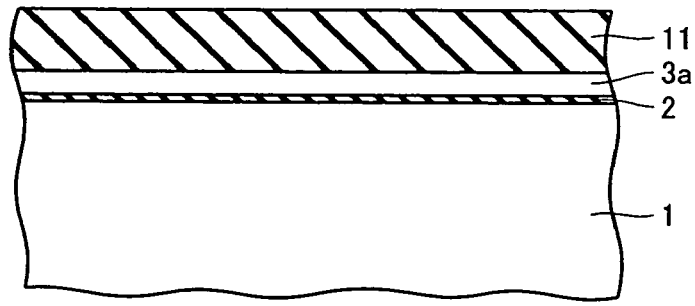
FIG. 4 illustrates fabricating the FIG. 1 nonvolatile memory device, a first silicon layer underlying a passivation film implemented by a silicon nitride film.

The above nonvolatile memory device is fabricated in a method as will now be described hereinafter. As shown in FIG. 4, initially on semiconductor substrate 1 tunnel insulation film 2 is formed. Subsequently on tunnel insulation film 2 a first silicon layer 3a is deposited in the form of an undoped amorphous silicon film. Note that an undoped film is a film with an impurity of a concentration of 5.0E18 ($5 \times 10^{18}$) atoms/cm$^3$ or lower. Typically, after it is deposited, amorphous silicon undergoes a step that is not specified to undergo a thermal treatment to be polycrystalline and its crystal grain size increases with its film thickness. Accordingly, to maintain the crystal grain size as small as possible, the film must have as small a thickness as possible. It is known, however, that a thickness reduced to approximately 10 nm impairs the directly underlying tunnel insulation film 2 in reliability. Accordingly, if amorphous silicon film 3a is adapted to have a thickness of 15-50 nm and deposited at approximately 520 to 530° C., the polysilicon film can have a crystal grain size with a maximum value of at most 70 nm. In particular, to allow the polysilicon film to have a crystal grain size reduced to approximately at most 30 nm, it is desirable that the amorphous silicon film have a thickness of approximately 20 to 40 nm.

Subsequently on the first silicon layer 3a a silicon nitride film 11 is deposited to serve as a temporal passivation film and a single mask is used to etch silicon nitride film 11, the first silicon layer 3a and tunnel insulation film 2 to form a tunnel insulation film pattern, a first silicon layer pattern and a silicon nitride film pattern. Subsequently the silicon nitride film pattern is used as a mask to etch an upper portion of silicon substrate 1 between first silicon layer patterns to form a trench 12, which in turn has an internal surface oxidized to have a trench internal wall oxide film (not shown) thereon.

Figure 5:
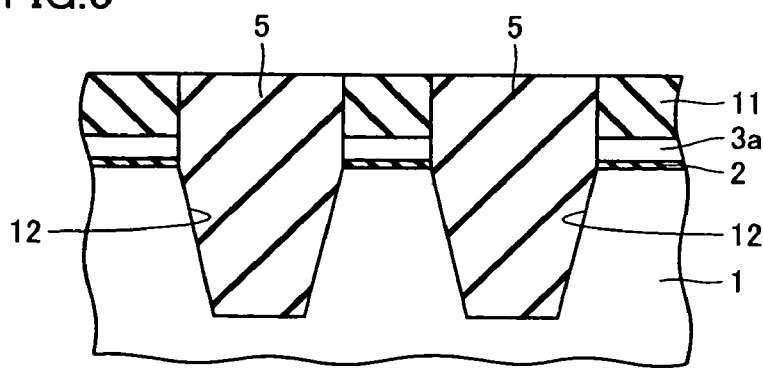
FIG. 5 illustrates providing a trench filling it with insulation film.
Figure 6:
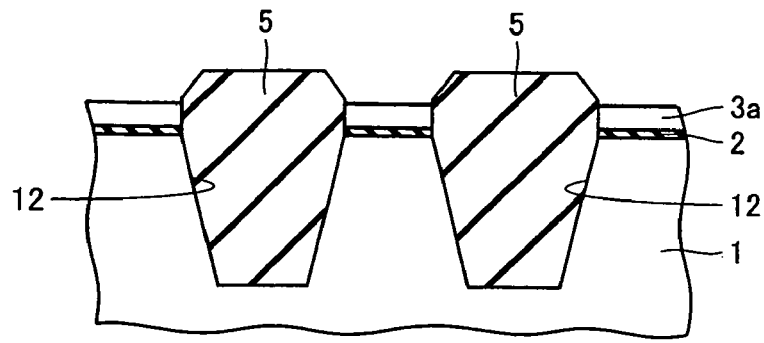
FIG. 6 shows a condition with the passivation film removed.

Then, as shown in FIG. 5, a chemical vapor deposition (CVD) oxide film 5 is introduced to fill trench 12 while covering the silicon nitride film's pattern 11, and thereafter until silicon nitride film pattern 11 is exposed CVD oxide film 5 is etched back or chemically mechanically polished and thus planarized. Then, as shown in FIG. 6, hydrofluoric acid is used to etch CVD oxide film 5 to adjust the step of the element isolation and thereafter thermal phosphoric acid is used to remove silicon nitride film 11. When element isolating insulation film 5 formed of CVD oxide film is etched with hydrofluoric acid by small amount it protrudes from semiconductor substrate 1, and when it is thus etched by large amount it recedes from semiconductor substrate 1. In the first embodiment if the first silicon film has small thickness, and the etching with hydrofluoric acid etches the tunnel oxide film in the lateral direction, the tunnel oxide film is impaired in reliability. Accordingly, desirably, element isolating insulation film 5 is etched in an amount adjusted so that in its final geometry it is flush with or also protrudes from the first silicon layer.

Figure 7:
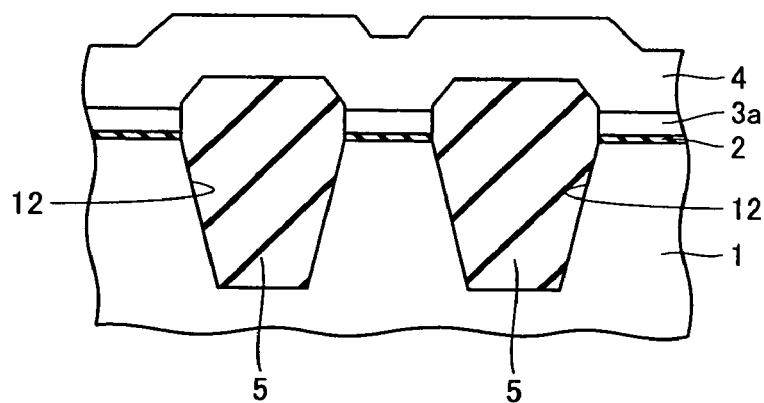
FIG. 7 shows a condition with a second polysilicon film deposited.

Then, as shown in FIG. 7, the first silicon layer pattern 3a and element isolating insulation film 5 has the second silicon layer 4 deposited thereon for a floating gate. Herein, to allow the second silicon layer 4 to be conductive, P is introduced as impurity by the following techniques: (i) in depositing the layer, phosphine may be used in-situ to provide doped amorphous silicon or (ii) undoped amorphous silicon or polysilicon previously provided may be doped with P by ion injection. For the P's concentration, desirably (i) for the doped amorphous silicon, approximately 1.0E20 to 5.0E20 ($1\times10^{20}$ to $5\times10^{20}$) atoms/cm$^3$ is employed, and (ii) for the ion injection, and undoped polysilicon having a thickness of approximately 100 nm, a voltage of 10-20 keV is applied and the impurity has a flux density of approximately 1 to 3.0E15 ($1\times10^{15}$ to $3\times10^{15}$) atoms/cm$^2$. This allows the second silicon layer to alone have a P concentration optimal for device operation, i.e., approximately 0.5 to 5E20 ($0.5\times10^{20}$ to $5\times10^{20}$) atoms/cm$^3$. Note that while the present embodiment employs an n type impurity implemented by P, a p type impurity implemented for example by boron (B) may be employed if a gate electrode is formed to be of p type. In that case, BC13 or similar chemical compound may be used as a source gas to provide doped polysilicon, or B, BF2 or the like may be introduced, and desirably the second silicon layer has a B concentration similarly of approximately 0.5E20 to 5E20 ($0.5\times10^{20}$ to $5\times10^{20}$) atoms/cm$^3$.

If the above described condition is applied to dope the second silicon layer 4 with P then in a subsequent process a thermal treatment can be performed to apply heat corresponding to annealing at 900° C. for 15 minutes or more to introduce the second silicon layer's P into the first silicon layer through thermal diffusion while the first silicon layer maintains small crystal grain size. Note that for 800° C. a thermal treatment corresponding to at least one hour can achieve a similar effect and for at least 1000° C. a thermal treatment corresponding to at least one minute can achieve a similar effect. As a result, undoped amorphous silicon's suction effect allows the first silicon layer, having a P concentration lower than the second silicon layer, to now have a P concentration approximately several times higher than the initial state, as shown in FIG. 3. Note that after its deposition, amorphous silicon undergoes a thermal treatment, which is not particularly specified, to be polysilicon or polycrystalline silicon.

Then the second silicon layer overlying the element isolating insulation film is partially removed to form a second silicon layer pattern (see FIGS. 1 and 2). Subsequently on the second silicon layer pattern an interlayer dielectric film 12 and a control gate 13 are sequentially provided.

Thus while the overlying second polysilicon layer has a maximum crystal grain size reaching at least 100 nm, the first polysilicon layer can have a crystal grain size of approximately 30 nm and at most 70 nm, and the following distribution of an impurity is obtained. The first polysilicon layer can have a P concentration having a maximum value of approximately at least 1E20 to 1E21 ($1\times10^{20}$ to $1\times10^{21}$) atoms/cm$^3$ and the second polysilicon layer can have a P concentration having a maximum value of approximately 0.5E20 to 5E20 ($0.5\times10^{20}$ to $5\times10^{20}$) atoms/cm$^3$ (as seen relatively, approximately at most ½ of that of the first polysilicon, average concentration is slightly reduced due to diffusing into the first polysilicon).

Thus a polysilicon layer directly adjacent to a tunnel oxide film that has a grain size reduced to approximately 30 nm allows a reduced range of post-erasure Vth distribution in flash memory operation. As a result, erasure operation can be completed in a short period of time so that rapid device operation as well as increased yield can be achieved.

Figure 8:
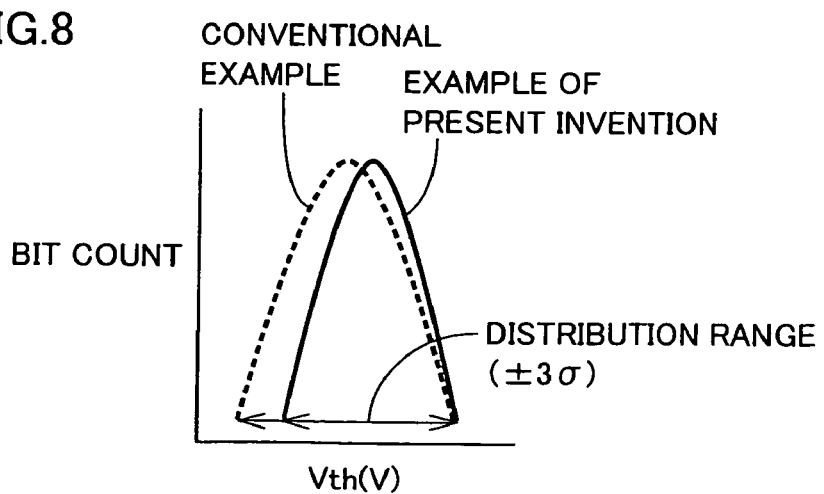
FIG. 8 represents a Vth distribution after erasure operation (a comparison between an example of the present invention and a conventional example).

Furthermore the first silicon layer is not directly doped with P and the diffusion of P from the second silicon layer is instead controlled so that the first and second silicon films' respective P concentrations provided immediately after the second silicon film has impurity introduced therein are inverted to allow the first silicon layer's P concentration to be higher than the second silicon layer's P concentration. This can eliminate the step of doping the first silicon layer with impurity and also resolve deficiency attributed to directly doping the first silicon layer. For example if the first polysilicon layer is doped in-situ to be doped polysilicon or doped amorphous silicon the first polysilicon layer will unavoidably have a crystal grain size increased to be at least 100 nm regardless of film thickness. By preventing the first silicon layer from having crystal grains increased in size, as described above, Vth (or transistor's threshold voltage value) of each bit after erasure operation can have a narrow distribution, as shown in FIG. 8, even if the gate more or less has variation in dimension.

If the first polysilicon layer receives ions directly injected thereinto, it is impossible to introduce P or similar impurity only into the first polysilicon layer of a thin portion of several tens nm directly adjacent to the tunnel insulation film without damaging tunnel insulation film 2. In accordance with the present invention while the first polysilicon layer can maintain a small crystal grain size, the first silicon layer can efficiently be doped with P of higher concentration while the tunnel insulation film is not impaired. As a result, depletion in a vicinity of an interface of a floating gate closer to the tunnel insulation film can be reduced, and voltage can efficiently be applied to tunnel insulation film 2, operation characteristics can be improved and sufficient operation rate can be obtained.

Second Embodiment

The present invention in a second embodiment is characterized in that the first polysilicon layer is increased in thickness and in addition thereto the first embodiment's satisfactory characteristic can be obtained. In the first embodiment a device structure, a method of fabrication and the like can require that the first silicon layer have a thickness of at least 50 nm. In that case, using amorphous silicon results in a crystal grain size increasing with film thickness and the present invention's object cannot be achieved. For such large film thickness, originally forming a polysilicon layer having a thickness in a range, as described hereinafter, allows as small a crystal grain size as approximately at most 30 nm.

More specifically, if the first polysilicon layer as originally deposited has a thickness set to be 50 to 70 nm, depositing the film at 600 to 650° C., preferably 620 to 630° C. allows the present invention's object to be achieved. Furthermore, if the first silicon layer has a thickness smaller than 30 nm, and polysilicon film is employed, then, as film is deposited at high temperature in a short period of time, an uneven polysilicon film is provided in a plane of a wafer, and the film also has a surface with protrusions and depressions caused as crystal grains grow. As a result, the tunnel insulation film tends to be substantially all defective in initial withstand voltage. Accordingly, normally for such a small range of film thickness, polysilicon film cannot be used. Polysilicon film having a thickness of at least 30 nm (and at most 70 nm) can be free of such concern.

Furthermore, if a thick film is deposited as done in the present embodiment, polysilicon film, deposited at a rate several times higher than amorphous silicon film, can eliminate a processing time disadvantageously increasing as the film's thickness increases. More specifically, if small film thickness is required, originally depositing an undoped amorphous silicon film allows a significantly uniform silicon film to be deposited with high precision, and if large film thickness is required, originally depositing a polysilicon film allows a silicon film having small crystal grains to be deposited in a short period of time.

Although it will overlap the description of the above embodiment, the embodiment's exemplary variation will now be described hereinafter. Furthermore, if a thick film is deposited as done in the embodiment it is not a requirement that element isolating insulation film 5 protrude from the first insulation film, and it may be lower than the first silicon layer. To prevent the tunnel insulation film from falling in at an end of an active region and thus thinning, being higher than a substrate is preferable. As such for example if element isolating insulation film 5 and the first silicon layer are provided to be flush or coplanar with each other, the second silicon layer is deposited flat so that in patterning the second silicon layer, short circuit attributed to residue from etching can be prevented.

When the impurity introduced into the second silicon layer is thermally diffused by a subsequent thermal process into the first silicon layer, the first silicon layer's maximum impurity concentration can be increased to be higher than the second silicon layer's maximum impurity concentration.

This method allows the first silicon layer to be sufficiently low in resistance and can ensure improved device operation performance.

As the first silicon layer's undoped silicon layer, undoped amorphous silicon film having a thickness of 15 to 50 nm can be deposited.

In accordance with the above described method, in the subsequent thermal process, amorphous's polycrystallization proceeds along with the impurity's thermal diffusion described above. When an amorphous layer of the above thickness is poly-crystallized, the obtained polysilicon will have a crystal grain size of at most 70 nm n. As a result, Vth distribution provided after erasure operation can be prevented from having increased ranges.

As the above described, first silicon layer's undoped silicon layer, an undoped polysilicon film having a thickness of 30 to 70 nm can be deposited.

If the first silicon layer is required to have large thickness, the above method allows the first polysilicon layer to have a crystal grain size of at most 70 nm, and Vth distribution provided after erasure operation can be prevented from having increased ranges.

In the above described, second silicon layer's doped silicon layer or impurity doped second silicon layer at that temporal point, an impurity concentration of P is 0.5E20 to 5E20 (0.5 to $5 \times 10^{20}$) atoms/cm$^3$.

The above described method allows the first polysilicon layer to have a sufficient concentration of P thermally diffused therethrough to ensure that the layer can be reduced in resistance.

In the above described nonvolatile memory device the first polysilicon layer can have a thickness set at 15 to 70 nm.

As such, if an amorphous silicon film having a thickness of 15 to 50 nm is used as a starting material or a polysilicon film having a thickness of 30 to 70 nm is used as a starting material the first polysilicon layer can have a crystal grain size of at most 70 nm. This can prevent increased periods of time otherwise required to recover an overerased bit.

The first and second polysilicon layers can contain P as an impurity of a concentration having a maximum value located in the first polysilicon layer. Furthermore, the P's concentration distributes from the second to first polysilicon layers continuously and can have a relative maximum in the first polysilicon layer. Furthermore, the first polysilicon layer's P concentration can have a maximum value set to be 1E20 to 1E21 ($1 \times 10^{20}$ to $1 \times 10^{21}$) atoms/cm$^3$ or larger.

This arrangement can reduce in electrical resistance the first polysilicon layer directly adjacent to the tunnel insulation film and thus provide increased device operation rate.

The present semiconductor device and method of fabrication thereof can ensure a tunnel insulation film's withstand voltage and other various characteristics in non volatile memory and in addition minimize increased grain sizes of a polysilicon layer adjacent to the tunnel insulation film and prevent Vth after erasure operation from having a distribution increased in range. Furthermore, the polysilicon layer adjacent to the tunnel insulation film can have an impurity sufficiently thermally diffused therethrough from an overlying polysilicon layer to provide enhanced device operation performance (speed and function). As such, it is expected to be utilized widely in the fields of mobile phone, digital camera, video and the like having a rapidly increasing demand for nonvolatile memory devices. It should be noted that the effect of preventing a transistor from having an increased Vth distribution range can be obtained not only for non volatile memory but semiconductor devices in general as well.

Although the present invention has been described and illustrated in detail, it is clearly understood that the same is by way of illustration and example only and is not to be taken by way of limitation, the spirit and scope of the present invention being limited only by the terms of the appended claims.

What is claimed is:
1. A semiconductor device comprising:
a semiconductor substrate;
isolating insulation films each filled a trench in said semiconductor substrate and having a portion protruding above said semiconductor substrate;

a gate insulation film formed between said isolating insulation films on and in contact with said semiconductor substrate;

a first polysilicon layer formed on and in contact with said gate insulation film; and a second polysilicon layer formed on said first polysilicon layer, wherein said first and second polysilicon layers contain an impurity allowing said first and second polysilicon layers to be conductor, and a distribution of said impurity's concentration throughout the first and second polysilicon layers has an absolute maximum value located in said first polysilicon layer, wherein said distribution substantially monotonously increases from said second polysilicon layer to said absolute maximum value and decreases from said absolute maximum value toward said gate insulation film.

2. The semiconductor device according to claim 1, wherein said first polysilicon layer has a crystal grain size of at most 70 nm.

3. The semiconductor device according to claim 1, wherein said first polysilicon layer has a thickness of 15 to 70 nm.

4. The semiconductor device according to claim 1, wherein said first polysilicon layer contains one of phosphorus and boron as said impurity, and a concentration of said impurity has a maximum value of at least $1 \times 10^{20}$ to $1 \times 10^{21}$ atoms/cm$^3$.

5. The semiconductor device according to claim 1, wherein said first polysilicon layer is smaller in maximum crystal grain size than said second polysilicon layer.

6. The semiconductor device according to claim 1, wherein said maximum value of said first polysilicon layer is at least two times higher than a maximum value of said second polysilicon layer.

7. A semiconductor device comprising:

a semiconductor substrate;

isolating insulation films each filled a trench in said semiconductor substrate and having a portion protruding above said semiconductor substrate;

a gate insulation film formed between said isolating insulation films on and in contact with said semiconductor substrate;

a first polysilicon layer formed on and in contact with said gate insulation film; and a second polysilicon layer formed on said first polysilicon layer, wherein said first polysilicon layer is smaller in crystal grain size than said second polysilicon layer in plan view, wherein said first and second polysilicon layers contain an impurity allowing said first and second polysilicon layers to be conductor, and a distribution of said impurity's concentration throughout the first and second polysilicon layers has an absolute maximum value located in said first polysilicon layer, wherein said distribution substantially monotonously increases from said second polysilicon layer to said absolute maximum value and decreases from said absolute maximum value toward said gate insulation film.

8. The semiconductor device according to claim 7, wherein said first polysilicon layer has a crystal grain size of at most 70 nm.

9. The semiconductor device according to claim 7, wherein said first polysilicon layer has a thickness of 15 to 70 nm.

10. The semiconductor device according to claim 7, wherein said first polysilicon layer contains one of phosphorus and boron as said impurity, and a concentration of said impurity has a maximum value of at least $1 \times 10^{20}$ to $1 \times 10^{21}$ atoms/cm$^3$.

11. The semiconductor device according to claim 7, wherein said first polysilicon layer is smaller in maximum crystal grain size than said second polysilicon layer.

12. The semiconductor device according to claim 7, wherein said maximum value of said first silicon layer is at least two times higher than said maximum value of said second silicon layer.

* * * * *